(12) United States Patent
Mase et al.

(10) Patent No.: US 10,684,371 B2
(45) Date of Patent: Jun. 16, 2020

(54) RANGING METHOD AND RANGING DEVICE

(71) Applicant: HAMAMATSU PHOTONICS K.K., Hamamatsu-shi, Shizuoka (JP)

(72) Inventors: Mitsuhito Mase, Hamamatsu (JP); Jun Hiramitsu, Hamamatsu (JP); Akihiro Shimada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 468 days.

(21) Appl. No.: 15/502,031

(22) PCT Filed: Aug. 4, 2015

(86) PCT No.: PCT/JP2015/072048
§ 371 (c)(1),
(2) Date: Feb. 6, 2017

(87) PCT Pub. No.: WO2016/027656
PCT Pub. Date: Feb. 25, 2016

(65) Prior Publication Data
US 2017/0234983 A1 Aug. 17, 2017

(30) Foreign Application Priority Data
Aug. 22, 2014 (JP) ................................ 2014-169166

(51) Int. Cl.
*G01S 17/10* (2020.01)
*G01S 17/89* (2020.01)
(Continued)

(52) U.S. Cl.
CPC ............... *G01S 17/10* (2013.01); *G01C 3/06* (2013.01); *G01S 7/4914* (2013.01);
(Continued)

(58) Field of Classification Search
USPC .............................................. 356/3.01–5.15
See application file for complete search history.

(56) References Cited

U.S. PATENT DOCUMENTS 9,344,657 B2 * 5/2016 Kim ...................... G01C 15/06
2011/0037969 A1 2/2011 Spickermann et al.
(Continued)

FOREIGN PATENT DOCUMENTS

CN 1991407 7/2007
CN 101784911 7/2010
(Continued)

OTHER PUBLICATIONS

English-language translation of International Preliminary Report on Patentability (IPRP) dated Mar. 9, 2017 that issued in WO Patent Application No. PCT/JP2015/072048.

*Primary Examiner* — Luke D Ratcliffe
(74) *Attorney, Agent, or Firm* — Faegre Drinker Biddle & Reath LLP

(57) ABSTRACT

A ranging method uses a light source and a range sensor. The range sensor includes a charge-generating area and first and second charge-accumulating areas. Charges generated in the charge-generating area are transferred to the first charge-accumulating area during a first period so as to be accumulated in the first charge-accumulating area and the second charge-accumulating area during a second period so as to be accumulated in the second charge-accumulating area. A distance d to an object OJ is arithmetized based on a quantity of charges accumulated in the first charge-accumulating area and a quantity of charges accumulated in the second charge-accumulating area. When pulse light is emitted from the light source, the pulse light whose light-intensity stable period within the emission period of the pulse light is set in (Continued)

advance to be longer than each of the first and second periods is emitted from the light source.

9 Claims, 14 Drawing Sheets

(51) Int. Cl.
G01C 3/06 (2006.01)
G01S 7/4914 (2020.01)
G01S 7/4915 (2020.01)
H01L 27/146 (2006.01)
G01S 17/36 (2006.01)
H01L 27/148 (2006.01)
H01L 31/113 (2006.01)
H04N 5/374 (2011.01)
H04N 5/376 (2011.01)

(52) U.S. Cl.
CPC ............ *G01S 7/4915* (2013.01); *G01S 17/36* (2013.01); *G01S 17/89* (2013.01); *H01L 27/14609* (2013.01); *H01L 27/14614* (2013.01); *H01L 27/14643* (2013.01); *H01L 27/14812* (2013.01); *H01L 31/1133* (2013.01); *H04N 5/374* (2013.01); *H04N 5/3765* (2013.01)

(56) References Cited

U.S. PATENT DOCUMENTS

| 2012/0182540 | A1* | 7/2012 | Suzuki | G01S 7/4814 356/4.01 |
|---|---|---|---|---|
| 2013/0162973 | A1 | 6/2013 | Kamiyama et al. | |
| 2015/0301177 | A1* | 10/2015 | Tsukamoto | G01S 17/89 356/5.03 |
| 2015/0362586 | A1* | 12/2015 | Heinrich | G01S 17/08 356/5.01 |

FOREIGN PATENT DOCUMENTS

| JP | 2004-294420 A | 10/2004 |
|---|---|---|
| JP | 2005-235893 A | 9/2005 |
| JP | 2012-215480 A | 11/2012 |
| JP | 2013-206903 A | 10/2013 |

* cited by examiner

Fig.6
(a)
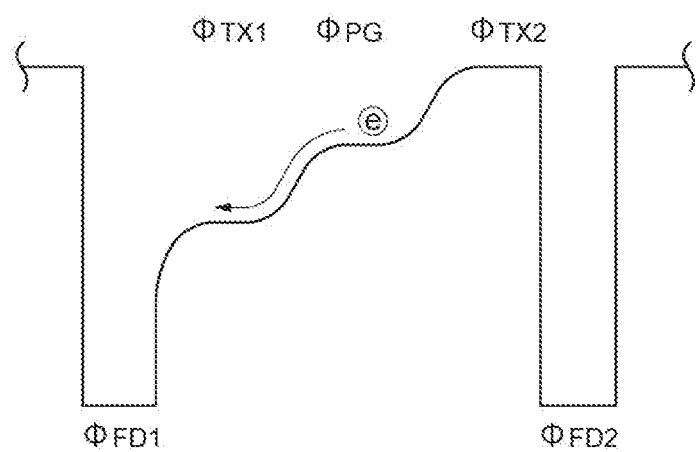
(b)
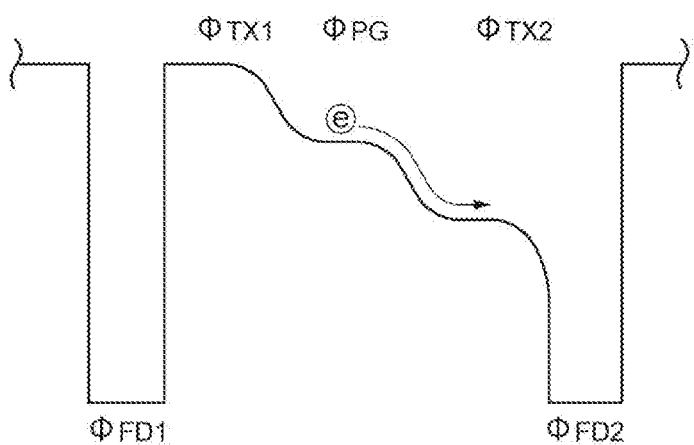

Fig.7
(a)
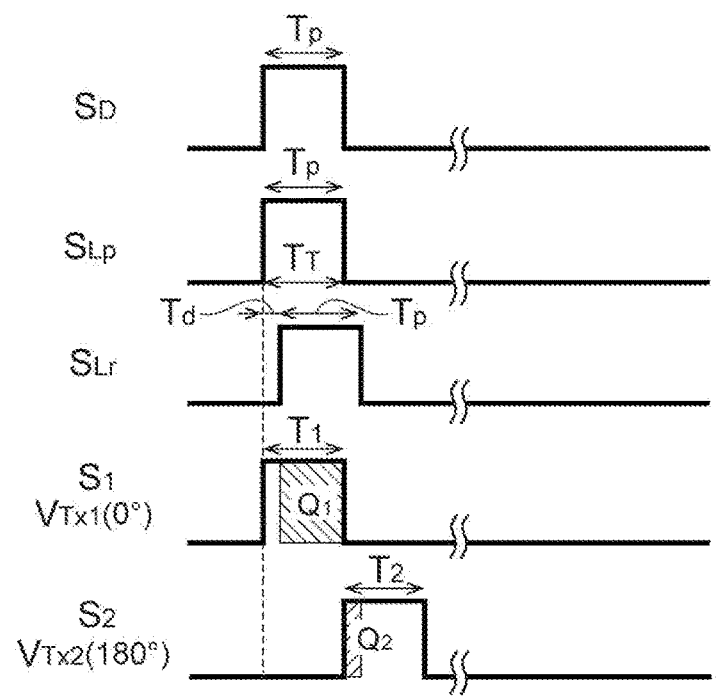
(b)
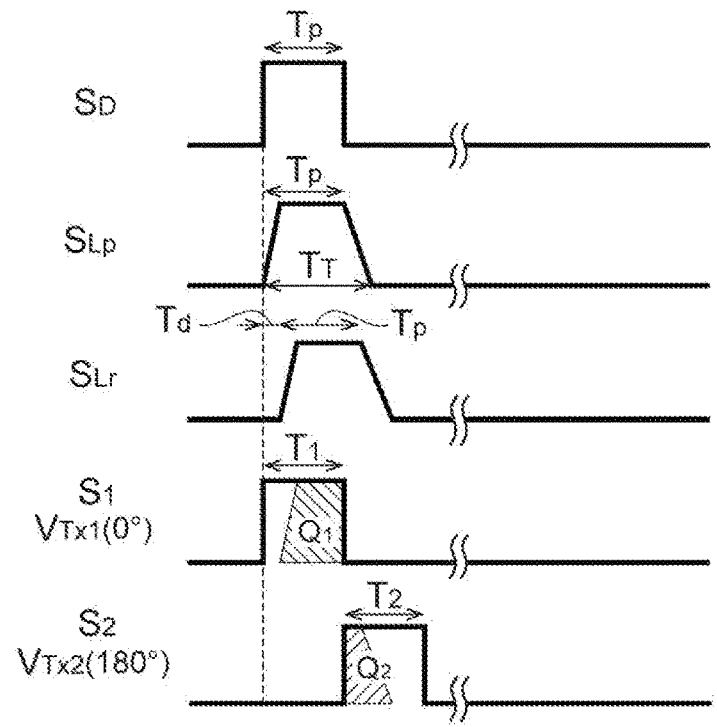
(c)
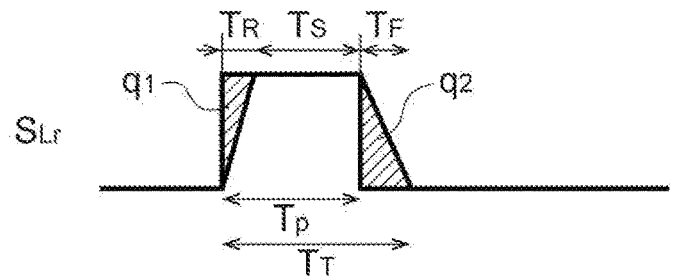

RANGING METHOD AND RANGING DEVICE

TECHNICAL FIELD

The present invention relates to a ranging method and a ranging device.

BACKGROUND ART

Known ranging devices include time-of-flight (TOF) type range sensors (for example, see Patent Literature 1.) A ranging device disclosed in Patent Literature 1 includes a range sensor provided with a light receiving layer, a photogate electrode for transferring charges, and a floating diffusion layer for taking the charges. In this ranging device, charges generated in the light receiving layer due to incident pulse light are allowed to flow into the floating diffusion layer by imparting the photogate electrode with pulse signals. The flowing charges are accumulated in the floating diffusion layer as signal charges. The charges accumulated in the floating diffusion layer are read out as output corresponding to a quantity of the accumulated charges. A distance to an object is calculated based on the output.

CITATION LIST

Patent Literature

Patent Literature 1: Japanese Unexamined Patent Publication No. 2005-235893

SUMMARY OF INVENTION

Technical Problem

In a ranging device such as a device disclosed in the abovementioned Patent Literature 1, even when a drive-signal of a light source has a square wave waveform, a light-intensity-signal of pulse light radiated from the light source will have a trapezoidal wave waveform including a rising period, a light-intensity stable period, and a falling period. During the rising period, the light intensity gradually increases and reaches a predetermined value. During the light-intensity stable period, the light intensity stays at the predetermined value or more. During the falling period, the light intensity falls below the predetermined value and gradually decreases. The present inventors have studied intensively and found that such a trapezoidal wave of the light-intensity-signal of the pulse light may deteriorate ranging accuracy of the ranging device. Therefore, there are demands on improvement of the ranging accuracy in the present technical field.

Solution to Problem

A ranging method according to an aspect of the present invention is a ranging method in which a light source configured to emit pulse light with respect to an object and a range sensor are used, the range sensor including a charge-generating area in which charges are generated in accordance with incident reflected light of the pulse light reflected off the object and a charge-accumulating area in which the charges generated in the charge-generating area are accumulated, the ranging method including: transferring the charges generated in the charge-generating area to the charge-accumulating area during a first period with respect to an emission period of the pulse light so as to accumulate the charges in the charge-accumulating area during the first period; transferring the charges generated in the charge-generating area to the charge-accumulating area during a second period different from the first period in timing and similar to the first period in width so as to accumulate the charges in the charge-accumulating area during the second period; arithmetizing a distance to the object based on a quantity of charges accumulated in the charge-accumulating area during the first period and a quantity of charges accumulated in the charge-accumulating area during the second period; and when emitting the pulse light from the light source, emitting the pulse light whose light-intensity stable period within the emission period of the pulse light is set in advance to be longer than each of the first and second periods, from the light source.

A ranging device according to an aspect of the present invention is a ranging device including a light source configured to emit pulse light with respect to an object and a range sensor configured to include a charge-generating area in which charges are generated in accordance with incident reflected light of the pulse light reflected off the object and a charge-accumulating area in which the charges generated in the charge-generating area are accumulated, the ranging device including: a charge-transfer unit configured to transfer the charges generated in the charge-generating area to the charge-accumulating area during a first period with respect to an emission period of the pulse light so as to accumulate the charges in the charge-accumulating area during the first period and configured to transfer the charges generated in the charge-generating area to the charge-accumulating area during a second period different from the first period in timing and similar to the first period in width so as to accumulate the charges in the charge-accumulating area during the second period; a distance arithmetic member configured to arithmetize a distance to the object based on a quantity of charges accumulated in the charge-accumulating area during the first period and a quantity of charges accumulated in the charge-accumulating area during the second period; and a light source driving member configured to drive the light source to emit the pulse light whose light-intensity stable period within the emission period of the pulse light is set in advance to be longer than each of the first and second periods, from the light source.

In such inventions, the pulse light is emitted from the light source and the reflected light of the pulse light reflected off the object enters the range sensor. In the charge-generating area of the range sensor, the charges are generated in accordance with the incident reflected light. The charges generated in the charge-generating area are transferred to the charge-accumulating area during the first and second periods so as to be accumulated in the charge-accumulating area. The first and second periods are different in timing and are similar in width. The distance to the object is obtained based on each of the quantity of charges accumulated during the first and second periods.

In a case where the light-intensity-signal of the pulse light emitted from the light source has a trapezoidal wave waveform including a rising period and a falling period as mentioned above, compared to a case where the light-intensity-signal has a square wave waveform, the quantity of charges generated in the charge-generating area decreases in the rising period and increases in the falling period. Accordingly, for example, in a case where the first period overlaps with the rising period and where the second period overlaps with the falling period, the quantity of charges accumulated in the charge-accumulating area during the first period decreases, compared to the case of the square wave, and the quantity of charges accumulated in the charge-accumulating area during the second period increases, compared to the case of the square wave. In such manners, the quantities of charges used in order to obtain the distance to the object may change due to influences of the rising period and falling period. As a result, the ranging accuracy may be deteriorated.

Herein, in regard to the pulse light emitted from the light source, the light-intensity stable period within the emission period of the pulse light is set in advance to be longer than each of the first and second periods. Accordingly, in regard to the quantities of charges accumulated in the charge-accumulating area in each of the first and second periods, a percentage of the quantity of charges accumulated in accordance with the light-intensity stable period increases and percentages of the quantities of charges accumulated in accordance with the rising period and falling period decrease. Therefore, it is possible to reduce the influences of the rising period and falling period with respect to the ranging accuracy. As a result, the ranging accuracy can be improved.

When emitting the pulse light from the light source, the pulse light may be emitted after a start time of the first period. In such a case, in regard to the quantity of charges accumulated in the charge-accumulating area during the second period, the percentage of the quantity of charges accumulated in accordance with the light-intensity stable period of the pulse light increases more. As a result, the ranging accuracy can be improved especially in regard to a short distance.

A delay time of emission timing of the pulse light with respect to the start time of the first period may be set in advance to a time corresponding to a minimum value of a linearity area of a ranging profile which indicates a correlation between an actual distance and a distance obtained by the range sensor. In such a case, it is possible to measure under a condition that a distance zero is offset to a distance at the minimum value. Therefore, even with respect to a distance range below the minimum value, the ranging accuracy can be improved.

The range sensor may include a plurality of the charge-accumulating areas and a plurality of transfer-electrodes configured to transfer the charges generated in the charge-generating area to the plurality of charge-accumulating areas. The plurality of transfer-electrodes may be imparted with transfer-signals having phases different from each other. In such a case, every time when the pulse light is emitted for once, the generated charges are accumulated in the different charge-accumulating areas in such a manner that the distance to the object can be obtained. Therefore, it is possible to prevent deterioration of the ranging accuracy due to time variation of the distance to the object.

The range sensor may include a transfer-electrode configured to transfer the charges generated in the charge-generating area to the charge-accumulating area, and the transfer-electrode may be imparted with a transfer-signal having a phase shifted intermittently at a predetermined timing. In such a case, ranging can be carried out by at least one transfer-electrode and one charge-accumulating area. Accordingly, it is possible to downsize the range sensor.

Advantageous Effects of Invention

According to an embodiment of the present invention, it is possible to provide a ranging method and a ranging device capable of improving ranging accuracy.

BRIEF DESCRIPTION OF DRAWINGS

FIG. 6 is a view illustrating potential profiles in the vicinity of a second principal surface of a semiconductor substrate taken along the line V-V in FIG. 4.

FIG. 7 is a view illustrating deterioration of ranging accuracy in a ranging method according to Comparative Example.

DESCRIPTION OF EMBODIMENTS

Figure 1:
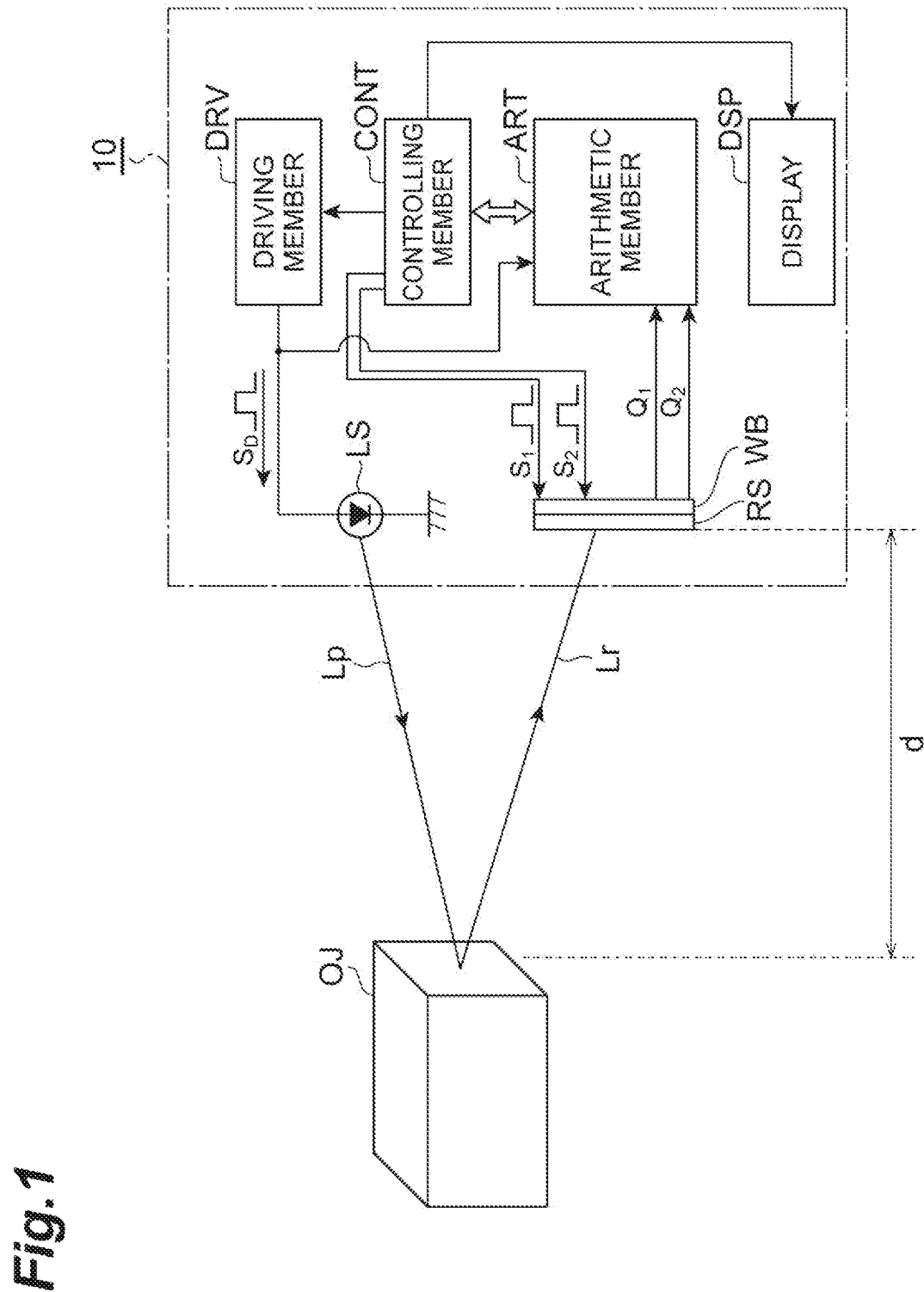
FIG. 1 is a configuration diagram of a ranging device according to the present embodiment.

An embodiment of the present invention will hereinafter be described in detail with reference to the accompanying drawings. It should be noted that elements having common elements and performances will be denoted with the same reference numeral and redundant explanations will be omitted herein.

FIG. 1 is a configuration diagram of a ranging device according to the embodiment.

A ranging device 10 measures a distance d to an object OJ. The ranging device 10 includes a range image sensor RS, light source LS, display DSP, and control unit. The control unit includes a driving member (light source driving member) DRV, controlling member CONT, and arithmetic member (distance arithmetic member) ART. The light source LS emits pulse light Lp with respect to the object OJ. The light source LS includes, for example, a laser irradiation device, and LED. The range image sensor RS is a charge-distribution type range image sensor. The range image sensor RS is disposed upon a wiring board WB.

The control unit (the driving member DRV, controlling member CONT, and arithmetic member ART) includes an arithmetic circuit such as a central processing unit (CPU), a memory such as a random access memory (RAM) and read only memory (ROM), a power circuit, and hardware such as a readout circuit including an A/D converter. This control unit may partially or entirely include an integrated circuit such as an application specific integrated circuit (ASIC) or field programmable gate array (FPGA.)

The driving member DRV applies a drive-signal $S_D$ to the light source LS in accordance with a control of the controlling member CONT and drives the light source LS in such a manner that the pulse light Lp is emitted toward the object OJ. The controlling member CONT not only controls the driving member DRV but also outputs first and second transfer-signals $S_1$ and $S_2$ to the range image sensor RS. The controlling member CONT controls the display DSP to display arithmetic results of the arithmetic member ART. The arithmetic member ART reads out each quantity of charges $Q_1$, $Q_2$ from the range image sensor RS. The arithmetic member ART arithmetizes the distance d based on the readout quantities of charges $Q_1$, $Q_2$ and outputs the arithmetic results to the controlling member CONT. An arithmetic method of the distance d will be described later with reference to FIG. 7. The arithmetic results of the arithmetic member ART are input from the controlling member CONT to the display. The display DSP displays the arithmetic results.

In the ranging device 10, the drive-signal $S_D$ is applied to the light source LS in such a manner that the pulse light Lp is emitted from the light source LS. When the pulse light Lp emitted from the light source LS enters the object OJ, reflected pulse light Lr is reflected off the object OJ and is emitted therefrom. The reflected light Lr emitted from the object OJ enters the charge-generating area of the range image sensor RS.

The range image sensor RS outputs the quantities of charges $Q_1$, $Q_2$ synchronizing with the first and second transfer-signals $S_1$, $S_2$ and collected per pixel. The output quantities of charges $Q_1$, $Q_2$ are input to the arithmetic member ART, synchronizing with the drive-signal $S_D$. The arithmetic member ART arithmetizes the distance d per pixel based on the input quantities of charges $Q_1$, $Q_2$ and the arithmetic results are input to the controlling member CONT. The arithmetic results inputted to the controlling member CONT are transferred to and displayed on the display DSP.

Figure 2:
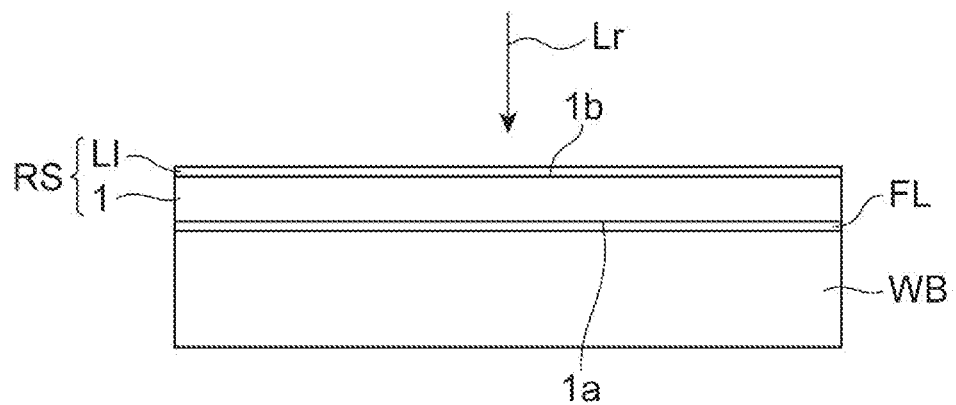
FIG. 2 is a cross sectional view illustrating a configuration of a range image sensor.

FIG. 2 is a cross-sectional view of a configuration of the range image sensor.

The range image sensor RS is a front-illuminated range image sensor. The range image sensor RS includes a semiconductor substrate 1 and a light intercepting layer LI. The semiconductor substrate 1 includes first and second principal surfaces 1a, 1b opposing each other. The second principal surface 1b is a light-incident surface. The range image sensor RS is bonded to the wiring board WB through an adhesive area FL with the first principal surface 1a side of the semiconductor substrate 1 opposing the wiring board WB. The adhesive area FL includes an insulating adhesive and a filler. The light intercepting layer LI is disposed in front of the second principal surface 1b of the semiconductor substrate 1. The reflected light Lr enters the range image sensor RS from the second principal surface 1b of the semiconductor substrate 1.

Figure 3:
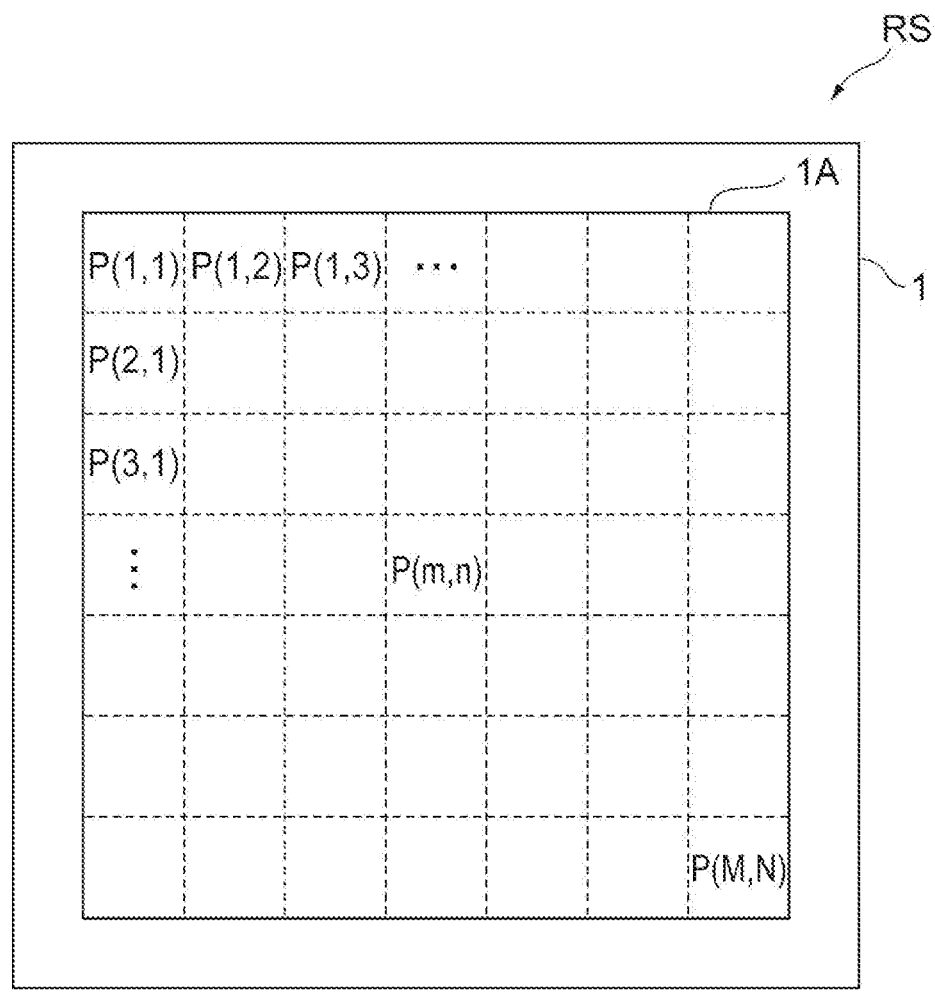
FIG. 3 is a schematic plane view of the range image sensor.

FIG. 3 is a schematic plane view of the range image sensor. It should be noted that the light intercepting layer LI is omitted in FIG. 3.

The semiconductor substrate 1 of the range image sensor RS includes an image pickup area 1A including a plurality of range sensors P (m, n) arranged in a two-dimensional manner. Each of the range sensors P (m, n) outputs the abovementioned two quantities of charges $Q_1$, $Q_2$. Accordingly, the reflected light Lr reflected off the object OJ is formed into an image in the image pickup area 1A and a distance image of the object OJ is obtained. One range sensor P (m, n) functions as one pixel. It should be noted that two or more range sensors P (m, n) may function as one pixel.

Figure 4:
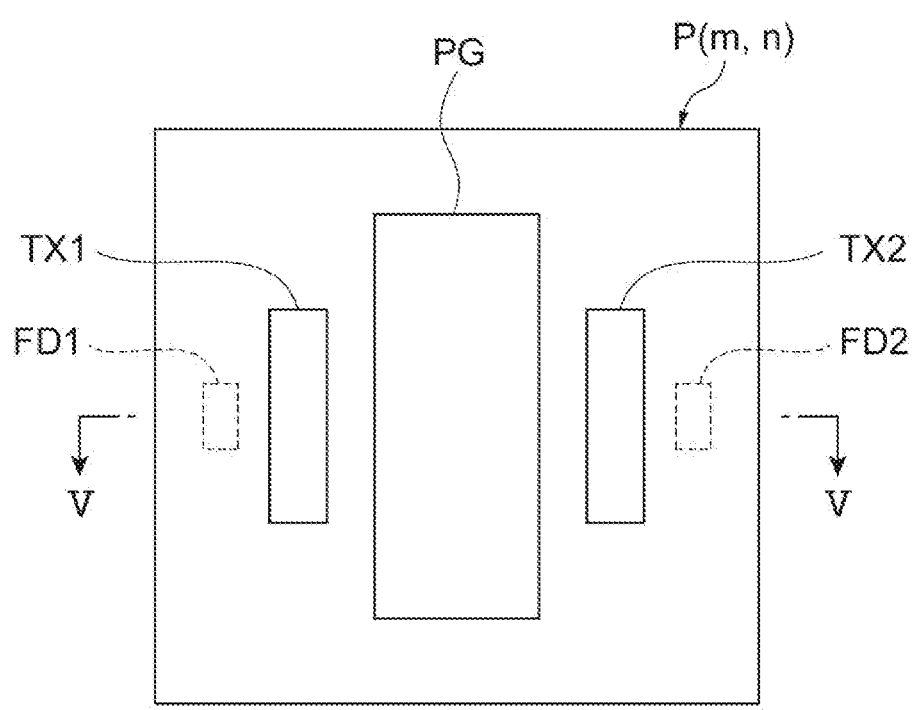
FIG. 4 is a view illustrating a configuration of the range sensor.
Figure 5:
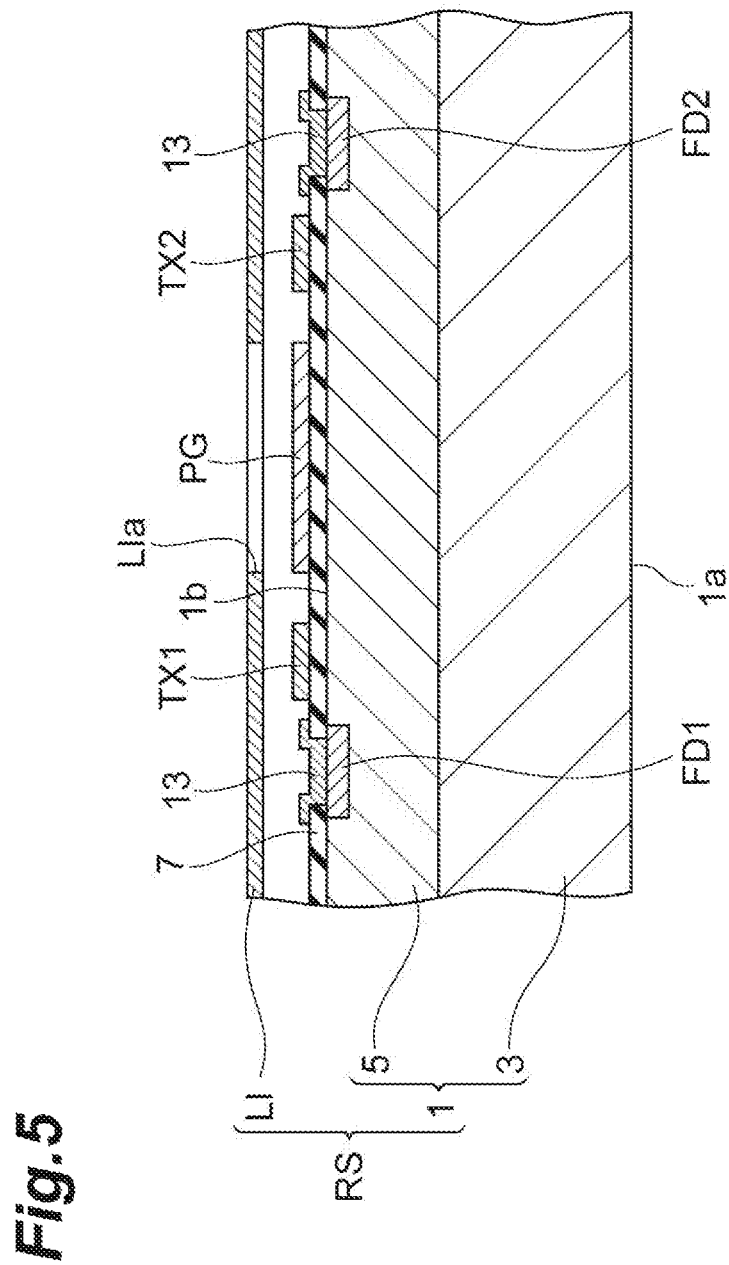
FIG. 5 is a cross sectional view of the configuration taken along the line V-V in FIG. 4.

FIG. 4 is a view illustrating a configuration of the range sensor. FIG. 5 is a cross-sectional view of the configuration taken along the line V-V in FIG. 4. It should be noted that the light intercepting layer LI is omitted in FIG. 4.

As mentioned above, the range image sensor RS includes the light intercepting layer LI in front of the second principal surface 1b which is the light-incident surface. An aperture LIa is formed in an area corresponding to each of the range sensors P (m, n) of the light intercepting layer LI. The aperture LIa is of a rectangular shape. Herein, the aperture LIa is shaped in a rectangle. The light passes through the aperture LIa of the light intercepting layer LI and enters the semiconductor substrate 1. Accordingly, the aperture LIa defines a light-receiving area in the semiconductor substrate 1. The light intercepting layer LI includes a metal such as aluminum and the like.

The semiconductor substrate 1 includes a p-type first semiconductor area 3 and a $p^-$-type second semiconductor area 5 having an impurity concentration lower than the first semiconductor area 3. The first semiconductor area 3 is disposed in the first principal surface 1a side. The second semiconductor area 5 is disposed in the second principal surface 1b. The semiconductor substrate 1 can be obtained, for example, by growing upon a p-type semiconductor substrate, a $p^-$-type epitaxial layer having an impurity concentration lower than that of the semiconductor substrate. An insulating layer 7 is formed upon the second principal surface 1b (second semiconductor area 5) of the semiconductor substrate 1.

Each of the range sensors P (m, n) is the charge-distribution type range sensor. Each of the range sensors P (m, n) includes a photogate electrode PG first and second charge-accumulating areas FD1, FD2, and first and second transfer-electrodes TX1, TX2. The photogate electrode PG is disposed in accordance with the aperture LIa. An area corresponding to the photogate electrode PG in the semiconductor substrate 1 (second semiconductor area 5) (an area located below the photogate electrode PG in FIG. 5) performs as a charge-generating area where charges are generated in accordance with the incident reflected light Lr of the pulse light Lp reflected off the object OJ. The photogate electrode PG corresponds to the shape of aperture LIa and is of a rectangular shape in a plane view. Herein, the photogate electrode PG is shaped in a rectangle as similar to the aperture LIa.

The first and second charge-accumulating areas FD1, FD2 are disposed to sandwich the photogate electrode PG. The first and second charge-accumulating areas FD1, FD2 are disposed separately from the photogate electrode PG. Each of the first and second charge-accumulating areas FD1, FD2 is of a rectangular shape in a plane view. In the present embodiment, each of the first and second charge-accumulating areas FD1, FD2 is of a square shape in the plane view and similar to each other in shape. The first and second charge-accumulating areas FD1, FD2 are n-type semiconductor areas having high impurity concentrations formed in the second semiconductor area 5. The first and second charge-accumulating areas FD1, FD2 accumulate charges generated in the charge-generating area as signal charges.

The first transfer-electrode TX1 is disposed upon the insulating layer 7 and between the first charge-accumulating area FD1 and the photogate electrode PG. The first transfer-electrode TX1 is disposed separately from both the first charge-accumulating area FD1 and the photogate electrode PG. The first transfer-electrode TX1 transfers the charges generated in the charge-generating area to the first charge-accumulating area FD1 during a first period $T_1$ (see FIG. 7)

in accordance with the first transfer-signal $S_1$ (see FIG. 7). The first period $T_1$ corresponds to an emission period $T_T$ of the pulse light Lp (see FIG. 7).

The second transfer-electrode TX2 is disposed upon the insulating layer 7 and between the second charge-accumulating area FD2 and the photogate electrode PG. The second transfer-electrode TX2 is disposed separately from both the second charge-accumulating area FD2 and the photogate electrode PG. The second transfer-electrode TX2 transfers the charges generated in the charge-generating area to the second charge-accumulating area FD2 during a second period $T_2$ (see FIG. 7) in accordance with the second transfer-signal $S_2$ (see FIG. 7) having a phase different from that of the first transfer-signal $S_1$. The second period $T_2$ is different from the first period $T_1$ in timing and is similar to the first period $T_1$ in width.

As mentioned above, the controlling member CONT outputs the first and second transfer-signals $S_1$, $S_2$. The first and second transfer-signals $S_1$, $S_2$ output by the controlling member CONT are applied to the first and second transfer-electrodes TX1, TX2. Accordingly, the first and second transfer-electrodes TX1, TX2 distribute the charges generated in the charge-generating area and transfer to the first and second charge-accumulating areas FD1, FD2. Therefore, a part of the controlling member CONT and the first and second transfer-electrodes TX1, TX2 function as a charge-transfer unit.

Each of the first and second transfer-electrodes TX1, TX2 is of a rectangular shape in the plane view. Herein, each of the first and second transfer-electrodes TX1, TX2 is shaped in a rectangle and similar to each other in shape. Lengths of long sides of the first and second transfer-electrodes TX1, TX2 are shorter than lengths of long sides of the photogate electrode PG.

The insulating layer 7 is provided with contact holes for exposing the surface of the second semiconductor area 5. Conductors 13 for connecting the first and second charge-accumulating areas FD1, FD2 to the outside thereof are disposed in the contact holes.

Herein, a phrase "impurity concentration is high" represents that the impurity concentration is, for example, equal to or more than $1 \times 10^{17}$ cm$^{-3}$ and is indicated by "+" attached to the conductivity type. On the other hand, a phrase "impurity concentration is low" represents that the impurity concentration is, for example, equal to or less than $10 \times 10^{15}$ cm$^{-3}$ and is indicated by "−" attached to the conductivity type.

A thickness/impurity concentration of each semiconductor area is as follows. The first semiconductor area 3: thickness 10 to 1000 μm/impurity concentration $1 \times 10^{12}$ to $10^{19}$ cm$^{-3}$; second semiconductor area 5: thickness 1 to 50 μm/impurity concentration $1 \times 10^{12}$ to $10^{15}$ cm$^{-3}$; first and second charge-accumulating areas FD1, FD2: thickness 0.1 to 1 μm/impurity concentration $1 \times 10^{18}$ to $10^{20}$ cm$^{-3}$ The semiconductor substrate 1 (first and second semiconductor areas 3, 5) is imparted with a reference potential such as a ground potential through a back gate or a through-electrode or the like. The semiconductor substrate 1 includes Si, the insulating layer 7 includes SiO$_2$, and the photogate electrode PG and the first and second transfer-electrodes TX1, TX2 include poly-silicon. It should be noted that other materials may be included in these members.

There is a 180-degree-shift between the phase of the first transfer-signal $S_1$ applied to the first transfer-electrode TX1 and the phase of the second transfer-signal $S_2$ applied to the second transfer-electrode TX2. The light incident upon each of range sensors P (m, n) is converted into charges in the semiconductor substrate 1 (second semiconductor area 5.) A part of the charges generated in such manners are allowed to travel as the signal charges toward the first transfer-electrode TX1 or second transfer-electrode TX2 in accordance with potential gradient. The potential gradient is formed by voltage applied to the photogate electrode PG and to the first and second transfer-electrodes TX1, TX2.

When a positive potential is applied to the first transfer-electrode TX1 or the second transfer-electrode TX2, a potential of an area of the semiconductor substrate 1 (second semiconductor area 5) below the first transfer-electrode TX1 or the second transfer-electrode TX2 becomes lower with respect to electrons than a potential of an area of the semiconductor substrate 1 (second semiconductor area 5) below the photogate electrode PG. Accordingly, negative charges (electrons) are drawn in the direction of the first transfer-electrode TX1 or the second transfer-electrode TX2 and the negative charges are accumulated in potential wells formed by the first and second charge-accumulating areas FD1, FD2. Each of the n-type semiconductors contains a positively-ionized donor and has the positive potential and attracts the electrons. When a potential lower than the positive potential (for example, the ground potential) is applied to the first transfer-electrode TX1 or the second transfer-electrode TX2, a potential barrier is caused by the first transfer-electrode TX1 or the second transfer-electrode TX2. Therefore, the charges generated in the semiconductor substrate 1 are not drawn into the first and second charge-accumulating areas FD1 and FD2.

FIG. 6 is a view illustrating potential profiles in the vicinity of the second principal surface of the semiconductor substrate taken along the line V-V in FIG. 4.

In FIG. 6, downward directions represent positive directions of potentials. FIG. 6 shows a potential $\varphi_{TX1}$ of an area just below the first transfer-electrode TX1, a potential $\varphi_{TX2}$ of an area just below the second transfer-electrode TX2, a potential $\varphi_{PG}$ of the charge-generating area just below the photogate electrode PG, a potential $\varphi_{FD1}$ of the first charge-accumulating area FD1, and a potential $\varphi_{FD2}$ of the second charge-accumulating area FD2.

When the potentials ($\varphi_{TX1}$, $\varphi_{TX2}$) of the areas just below the adjacent first and second transfer-electrodes TX1, TX2 with no bias are defined as reference potentials, the potential $\varphi_{PG}$ of the area (charge-generating area) just below the photogate electrode PG is set to be higher than the reference potentials. The potential $\varphi_{PG}$ of the charge-generating area is higher than the potentials $\varphi_{TX1}$, $\varphi_{Tx2}$. Therefore, the potential profile will be shaped like a recess facing downward of the drawings in the charge-generating area.

An accumulating operation of the charges will be described with reference to FIG. 6. When the phase of the first transfer-signal $S_1$ applied to the first transfer-electrode TX1 is zero degree, the first transfer-electrode TX1 is imparted with the positive potential. The second transfer-electrode TX2 is imparted with a potential in the opposite phase, namely, a potential in a phase of 180 degrees (for example, the ground potential.) The photogate electrode PG is imparted with a potential between the potential given to the first transfer-electrode TX1 and the potential given to the second transfer-electrode TX2. In such a case, as illustrated in FIG. 6(a), the potential $\varphi_{TX1}$ of the semiconductor just below the first transfer-electrode TX1 falls below the potential $\varphi_{PG}$ of the charge-generating area. Therefore, the negative charges e generated in the charge-generating area are allowed to flow into the potential well of the first charge-accumulating area FD1.

On the other hand, the potential $\varphi_{TX2}$ of the semiconductor just below the second transfer-electrode TX2 will not fall. Therefore, the charges will not flow into the potential well of the second charge-accumulating area FD2. Accordingly, the charges are collected and accumulated in the potential well of the first charge-accumulating area FD1. Since the first and second charge-accumulating areas FD1 and FD2 are doped with n-type impurities, the potentials thereof are recessed in the positive direction.

When the phase of the second transfer-signal $S_2$ applied to the second transfer-electrode TX2 is zero degree, the second transfer-electrode TX2 is imparted with the positive potential. The first transfer-electrode TX1 is imparted with a potential in the opposite phase, that is, a potential in a phase of 180 degrees (for example, a ground potential.) The photogate electrode PG is imparted with a potential between the potential given to the first transfer-electrode TX1 and the potential given to the second transfer-electrode TX2. In such a case, as illustrated in FIG. 6(b), the potential $\varphi_{TX2}$ of the semiconductor just below the second transfer-electrode TX2 falls below the potential $\varphi_{PG}$ of the charge-generating area. Therefore, the negative charges e generated in the charge-generating area are allowed to flow into the potential well of the second charge-accumulating area FD2.

On the other hand, the potential q of the semiconductor just below the first transfer-electrode TX1 will not fall. Therefore, the charges will not flow into the potential well of the first charge-accumulating area FD1. Accordingly, the charges are collected and accumulated in the potential well of the second charge-accumulating area FD2.

In such manners, the charges are collected and accumulated in the potential wells of the first and second charge-accumulating areas FD1 and FD2. The charges accumulated in the potential wells of the first and second charge-accumulating areas FD1, FD2 are read out to the outside thereof.

FIG. 7 is a view illustrating deterioration of ranging accuracy in a ranging method according to Comparative Example. Specifically, FIG. 7(a) is a timing chart of various signals in a case where a light-intensity-signal of pulse light at a time when the pulse light is emitted from the light source will have an ideal square wave waveform. FIG. 7(b) is a timing chart of the various signals in an actual case. FIG. 7(c) is a view comparing a light-intensity-signal of reflected light when the light returns to an image pickup area.

First, with reference to FIG. 7(a), described is a case where a light-intensity-signal $S_{Lp}$ of pulse light Lp at a time when the pulse light Lp is emitted from the light source LS will have the ideal square wave waveform. FIG. 7(a) illustrates a drive-signal $S_D$ applied to the light source LS by the controlling member CONT, the light-intensity-signal $S_{Lp}$ of the pulse light Lp when the pulse light Lp is emitted from the light source LS, an intensity signal $S_{Lr}$ of reflected light Lr when the reflected light Lr returns to an image pickup area 1A, a first transfer-signal $S_1$ to be applied to the first transfer-electrode TX1, and a second transfer-signal $S_2$ to be applied to the second transfer-electrode TX2.

As illustrated in FIG. 7(a), the drive-signal $S_D$, light-intensity-signals $S_{Lp}$, $S_{Lr}$, and first and second transfer-signals $S_1$, $S_2$ are all pulse signals which are to have the ideal square wave waveform. These signals are all set to be at a low level in a state before the drive-signal $S_D$ is applied to the light source LS.

The drive-signal $S_D$ is a pulse signal of a pulse width Tp. The pulse width Tp of the drive-signal $S_D$ is equivalent to a setting value of a pulse width of the light-intensity-signal $S_{Lp}$. In such a case, since the light-intensity-signal $S_{Lp}$ has the ideal square wave waveform, the pulse width of the light-intensity-signal $S_{Lp}$ becomes equivalent to the pulse width Tp of the drive-signal $S_D$ according to the setting. The drive-signal $S_D$ is set at the low level after being set at a high level during the pulse width Tp. The light-intensity-signal $S_{Lp}$ rises simultaneously with a start time of applying the drive-signal $S_D$, and the light-intensity-signal $S_{Lp}$ is set at a level corresponding to the light intensity of the pulse light Lp. The light-intensity-signal $S_{Lp}$ falls after the pulse width Tp and is set at the low level.

Synchronizing with the emission of the pulse light Lp, the first and second transfer-signals $S_1$, $S_2$ are applied to the first and second transfer-electrodes TX1, TX2 in antiphase. Specifically, the first transfer-signal $S_1$ synchronizes with the light-intensity-signal $S_{Lp}$ by a phase difference of zero degree and is applied to the first transfer-electrode TX1 during the pulse width Tp so as to be set at the high level. The second transfer-signal $S_2$ synchronizes with the light-intensity-signal $S_{Lp}$ by a phase difference of 180 degrees and is applied to the second transfer-electrode TX2 during the pulse width Tp so as to be set at the high level. Periods when the first and second transfer-signals $S_1$, $S_2$ are set at the high level are first and second periods $T_1$, $T_2$ respectively. The first and second periods $T_1$, $T_2$ are different in timing and similar in width. In such a case, each width of the first and second periods $T_1$, $T_2$ is equivalent to the pulse width Tp of the drive-signal $S_D$.

The light-intensity-signal $S_{Lr}$ rises simultaneously with the time when the reflected light Lr returns to the image pickup area 1A and the light-intensity-signal $S_{Lr}$ is set at a level corresponding to the light intensity of the reflected light Lr. The light-intensity-signal $S_{Lr}$ falls after the pulse width Tp and is set at the low level. In such a case, the pulse width of the light-intensity-signal $S_{Lr}$ is equivalent to the pulse width Tp of the drive-signal $S_D$. A phase difference Td between the light-intensity-signal $S_{Lp}$ and light-intensity-signal $S_{Lr}$ is a time-of-flight of light. The phase difference Td corresponds to the distance d from the range image sensor RS to the object OJ.

The charges generated in the charge-generating area in accordance with the incident reflected light Lr are transferred to the first charge-accumulating area FD1 during the first period $T_1$ when the first transfer-signal $S_1$ is set at the high level with respect to an emission period $T_T$ of the pulse light Lp so as to be accumulated in the first charge-accumulating area FD1 during the first period $T_1$. The emission period $T_T$ of the pulse light Lp is a period when the light-intensity-signal $S_{Lp}$ is not at the low level. In such a case, the width of the emission period $T_T$ is equivalent to the pulse width Tp of the drive-signal $S_D$.

The charges generated in the charge-generating area in accordance with the incident reflected light Lr are transferred to the second charge-accumulating area FD2 during the second period $T_2$ when the second transfer-signal $S_2$ is set at the high level so as to be accumulated in the second charge-accumulating area FD2 during the second period $T_2$.

The charges are generated in the charge-generating area during a period when the reflected light Lr enters the area. Therefore, a quantity of charges $Q_1$ accumulated in the first charge-accumulating area FD1 will be a quantity of charges which are to be accumulated during a period, within the first period $T_1$, when the light-intensity-signal $S_{Lr}$ and first transfer-signal $S_1$ overlap. Furthermore, a quantity of charges $Q_2$ accumulated in the second charge-accumulating area FD2 will be a quantity of charges which are to be accumulated during a period, within the second period $T_2$, when the light-intensity-signal $S_{Lr}$ and second transfer-signal $S_2$ overlap.

The distance d is arithmetized by the following Formula (1) based on a rate (distribution ratio) of the quantity of charges $Q_1$ and quantity of charges $Q_2$. It should be noted that c represents velocity of light.

$$\text{distance } d=(c/2)\times(Tp\times Q_2/(Q_1+Q_2)) \quad (1)$$

A measurable distance range d in such a case depends on the width of each of the first and second periods $T_1$, $T_2$ and the measurable range is a range in which the phase difference Td is set within the width of each of the first and second periods $T_1$, $T_2$. In other words, the distance d when the phase difference Td becomes equivalent to the width of the each of the first and second periods $T_1$, $T_2$ is a maximum value of the measurable distance d. Therefore, a ranging range which is a width of a distance range to be measured can be set based on the width of each of the first and second periods $T_1$, $T_2$. It should be noted that "measurable" indicates that the distance d can be theoretically calculated by the abovementioned Formula (1).

With reference to FIGS. 7(*b*) and 7(*c*), the actual case will hereinafter be described. As illustrated in FIG. 7(*b*), the light-intensity-signal $S_{Lp}$, $S_{Lr}$ have trapezoidal wave waveforms. Each of the light-intensity-signal $S_{Lp}$, $S_{Lr}$ gradually increases and reaches a predetermined value during a rising period $T_R$, and stays at the predetermined value or more during a light-intensity stable period $T_S$, and then falls below the predetermined value and gradually decreases during a falling period $T_F$. In such a case, the emission period $T_T$ of the pulse light Lp becomes longer than the pulse width Tp of the drive-signal $S_D$.

It should be noted that the light-intensity stable period $T_S$ not only indicates a period when the light-intensity-signals $S_{Lp}$, $S_{Lr}$ become constant but also indicates a period when the light-intensity-signals $S_{Lp}$, $S_{Lr}$ are held, for example, at or within 5% of the maximum value. In a case where the period when the light-intensity-signals $S_{Lp}$, $S_{Lr}$ become constant is referred to as the light-intensity stable period $T_S$, a period in which the rising period $T_R$ and falling period $T_F$ are subtracted from the emission period $T_T$ of the pulse light Lp is the light-intensity stable period $T_S$. In such a case, the emission period $T_T$ of the pulse light Lp is equivalent to a sum of the width of the falling period $T_F$ and the pulse width Tp of the drive-signal $S_D$.

As illustrated in FIG. 7(*c*), in the actual case, compared to a case where the light-intensity-signals $S_{Lp}$, $S_{Lr}$ have the ideal square wave waveforms, the quantity of charges $Q_1$ decreases by a quantity of charges $q_1$ due to an influence of the rising period $T_R$. Furthermore, the quantity of charges $Q_2$ increases by a quantity of charges $q_2$ due to an influence of the falling period $T_F$. In such manners, in the ranging method according to Comparative Example, the ranging accuracy is deteriorated since the charge-distribution ratio is different from the ideal case.

Figure 8:
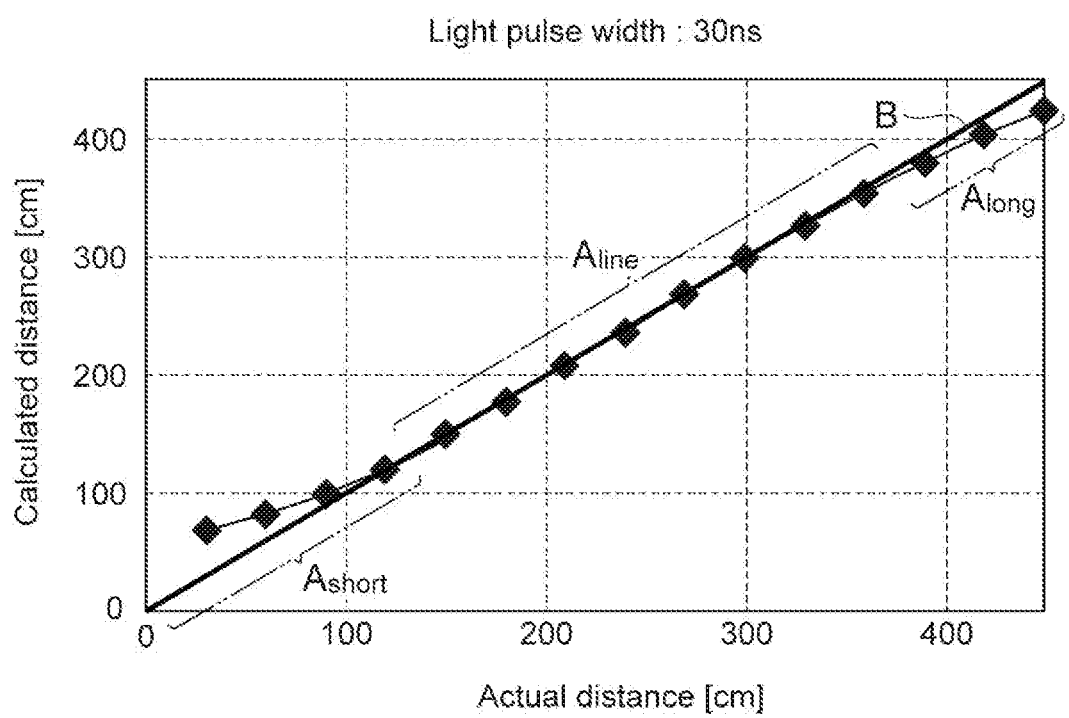
FIG. 8 is a ranging profile illustrating a correlation between an actual distance and a distance obtained by the ranging method according to Comparative Example.

FIG. 8 is a ranging profile illustrating a correlation between an actual distance and the distance obtained by the ranging method according to Comparative Example.

In FIG. 8, an actual distance d is taken along the abscissa, and a distance (a calculated distance) $d_{cal}$ obtained by the ranging method according to Comparative Example is taken along the ordinate. The pulse light Lp whose pulse width Tp of the drive-signal $S_D$ is 30 ns is obtained and used for the measurement. Ranges in the abscissa and ordinate are rangeable ranges when the width of each of the first and second periods $T_1$, $T_2$ is set to 30 ns as similar to the pulse width Tp of the drive-signal $S_D$. A linear line B is a straight line which passes through the origin of the coordinates and has an inclination of 1.

As illustrated in FIG. 8, the ranging profile is divided into a linearity area $A_{line}$, and non-linearity areas $A_{short}$, $A_{long}$. The linearity area $A_{line}$ is an area where the actual distance d and calculated distance $d_{cal}$ are substantially similar (equivalent) and where a difference of the calculated distance $d_{cal}$ from the actual distance d ($|d-d_{cal}|/d\times100(\%)$) is at or below a tolerance limit. The linearity area $A_{line}$ is, for example, an area where the difference is several % or less. In the linearity area $A_{line}$, the difference is so small that the ranging accuracy is high. In the linearity area $A_{line}$, measured data are substantially plotted on the linear line B.

On the other hand, the non-linearity areas $A_{shur}$, $A_{long}$ are areas other than the linearity area $A_{line}$. Those areas include an area where the actual distance d and calculated distance $d_{cal}$ are not equivalent in an area adjacent to at least the linearity area $A_{line}$. In other words, the non-linearity areas $A_{short}$, $A_{lomg}$ may include an area where the actual distance d and calculated distance $d_{cal}$ are equivalent in an area which is not adjacent to the linearity area $A_{line}$. The area where the actual distance d and calculated distance $d_{cal}$ are not equivalent indicates an area where the difference exceeds the tolerance limit, for example, the difference exceeds several %. The non-linearity area $A_{short}$ is plotted in a position closer to a short distance than the linearity area $A_{line}$. The non-linearity area $A_{long}$ is plotted in a position closer to a long distance than the linearity area $A_{line}$.

In the non-linearity areas $A_{short}$, $A_{long}$, the measured data are plotted in positions offset from the linear line B. In the non-linearity areas $A_{ssort}$, $A_{long}$, the difference is so large that the ranging accuracy is low. This is because the influence of the quantity of charges $q_2$ with respect to the quantity of charges $Q_2$ becomes large in the non-linearity area $A_{short}$. Furthermore, that is because the influence of the quantity of charges $q_1$ with respect to the quantity of charges $Q_1$ becomes large in the non-linearity area $A_{long}$.

Figure 9:
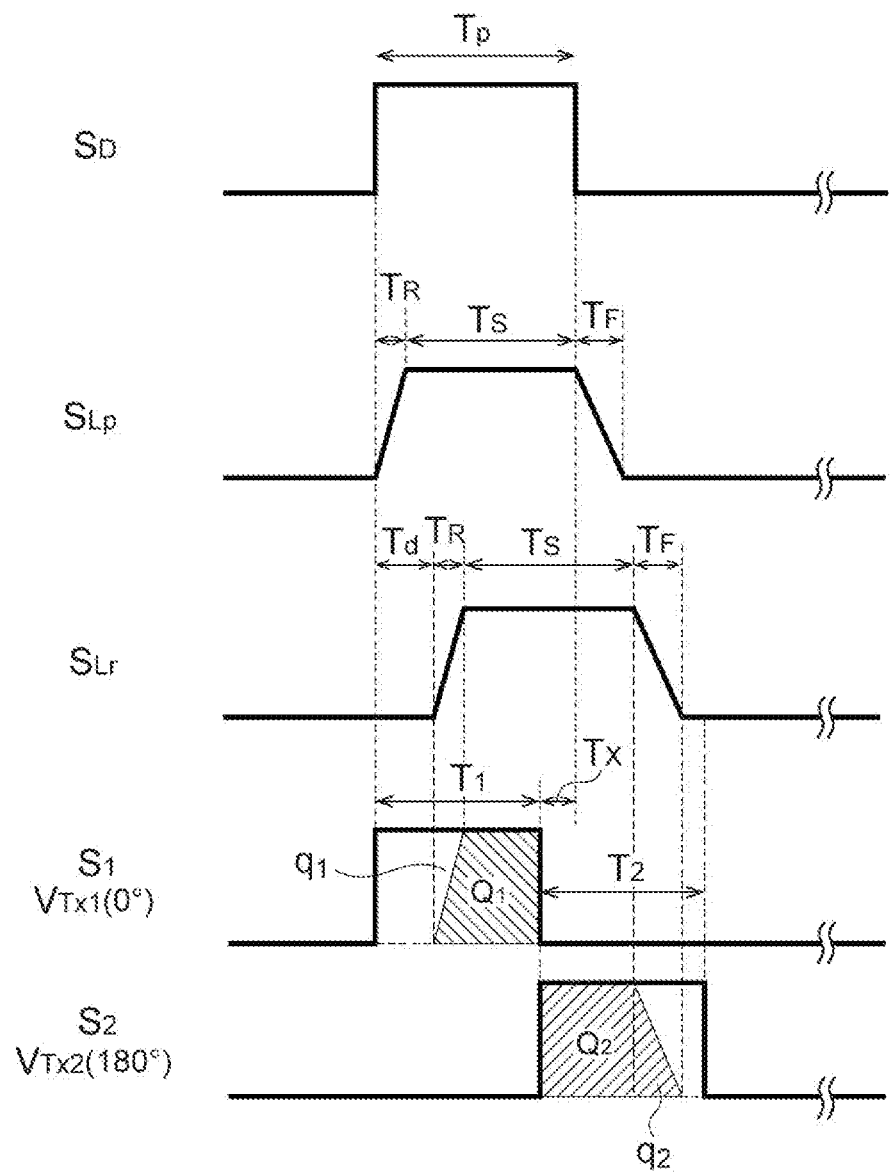
FIG. 9 is an example of a timing chart of various signals in a ranging method according to the present embodiment.

FIG. 9 is an example of a timing chart of various signals in a ranging method according to the present embodiment.

As illustrated in FIG. 9, in the example of the ranging method according to the present embodiment, the pulse width Tp of the drive-signal $S_D$ is set in advance to be longer than the width of each of the first and second periods $T_1$, $T_2$ by an extension time Tx. Accordingly, the width of the light-intensity stable period $T_S$ of the pulse light Lp emitted from the light source LS is set in advance to be longer than the width of each of the first and second periods $T_1$, $T_2$. Similar to Comparative Example, it should be noted that the first and second periods $T_1$, $T_2$ are different in timing and similar in width.

In such a case, in regard to the quantities of charges $Q_1$, $Q_2$ accumulated in the first and second charge-accumulating areas FD1, FD2, a percentage of the charges accumulated in accordance with the light-intensity stable period $T_S$ of the pulse light Lp increases. Therefore, in regard to the quantity of charges $q_1$ which decreases from the ideal case due to the rising period $T_R$, the influence of such a quantity of charges $q_1$ with respect to the quantity of charges $Q_1$ becomes small. Furthermore, in regard to the quantity of charges $q_2$ which increases from the ideal case due to the falling period $T_F$, the influence of such a quantity of charges $q_2$ with respect to the quantity of charges $Q_2$ becomes small. As a result, the influences of the rising period $T_R$ and falling period $T_F$ of the light-intensity-signal $S_{Lp}$ with respect to the ranging accuracy are reduced. Accordingly, the ranging accuracy can be improved.

Figure 10:
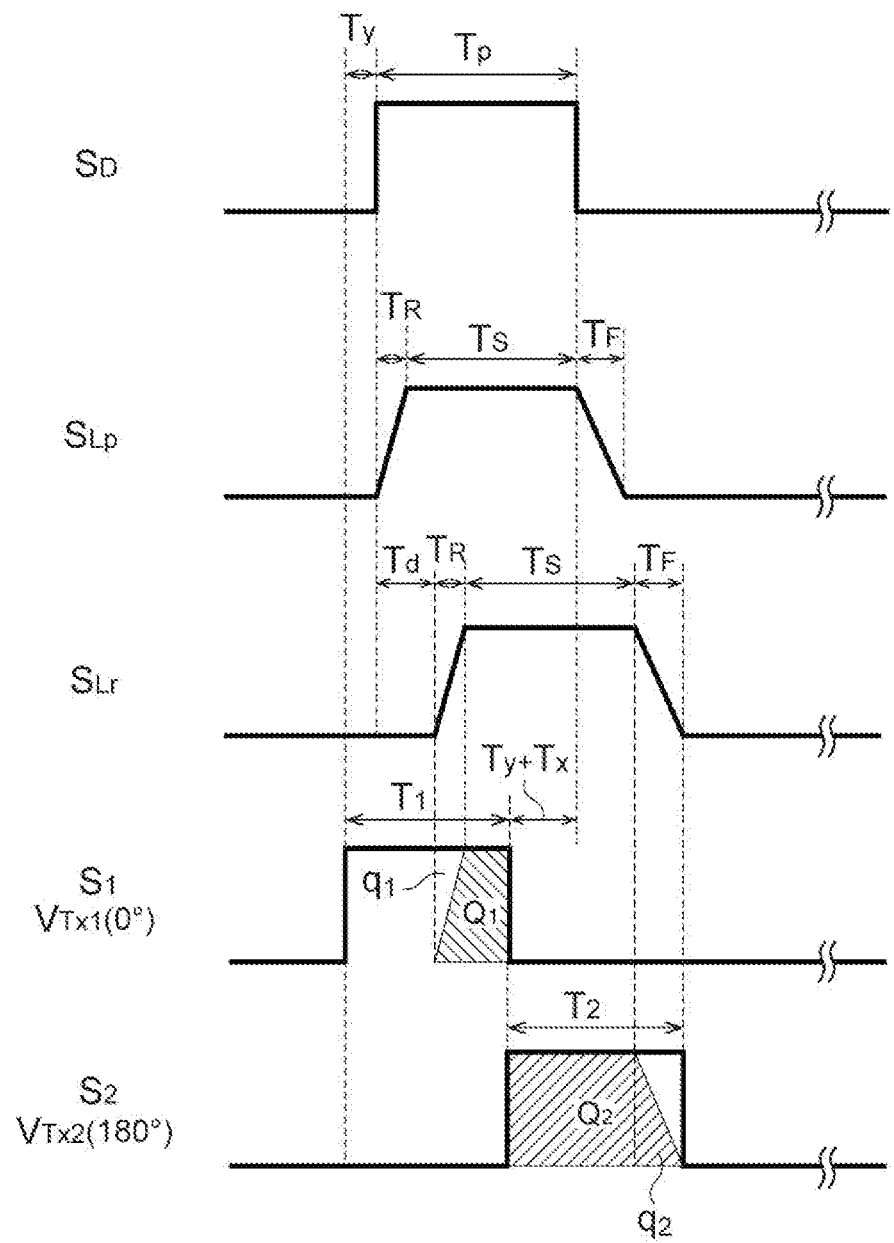
FIG. 10 is another example of the timing chart of the various signals in the ranging method according to the present embodiment.

FIG. 10 is another example of the timing chart of the various signals in the ranging method according to the present embodiment.

As illustrated in FIG. 10, in another example of the ranging method according to the present embodiment, the pulse width Tp of the drive-signal $S_D$ is set in advance to be longer than the width of each of the first and second periods $T_1$, $T_2$ by the extension time Tx. In addition, the drive-signal $S_D$ is set in advance to be applied later than the first transfer-signal $S_1$ by a delayed radiation time (delay time) Ty.

In such a case, in regard to the quantity of charges $Q_2$ accumulated in second charge-accumulating area FD2, the percentage of the charges accumulated in accordance with the light-intensity stable period $T_S$ of the pulse light Lp further increases. Accordingly, in regard to the quantity of charges $q_2$ which increases from the ideal case due to the falling period $T_F$, the influence of such a quantity of charges $q_2$ with respect to the quantity of charges $Q_2$ becomes further small. This reduces the influence of the falling period $T_F$ of the light-intensity-signal $S_{Lp}$ with respect to the ranging accuracy especially in regard to the short distance. As a result, the ranging accuracy can be improved especially in regard to the short distance. When calculating the distance d, it should be noted that a distance corresponding to the delayed radiation time Ty is necessarily offset.

Figure 11:
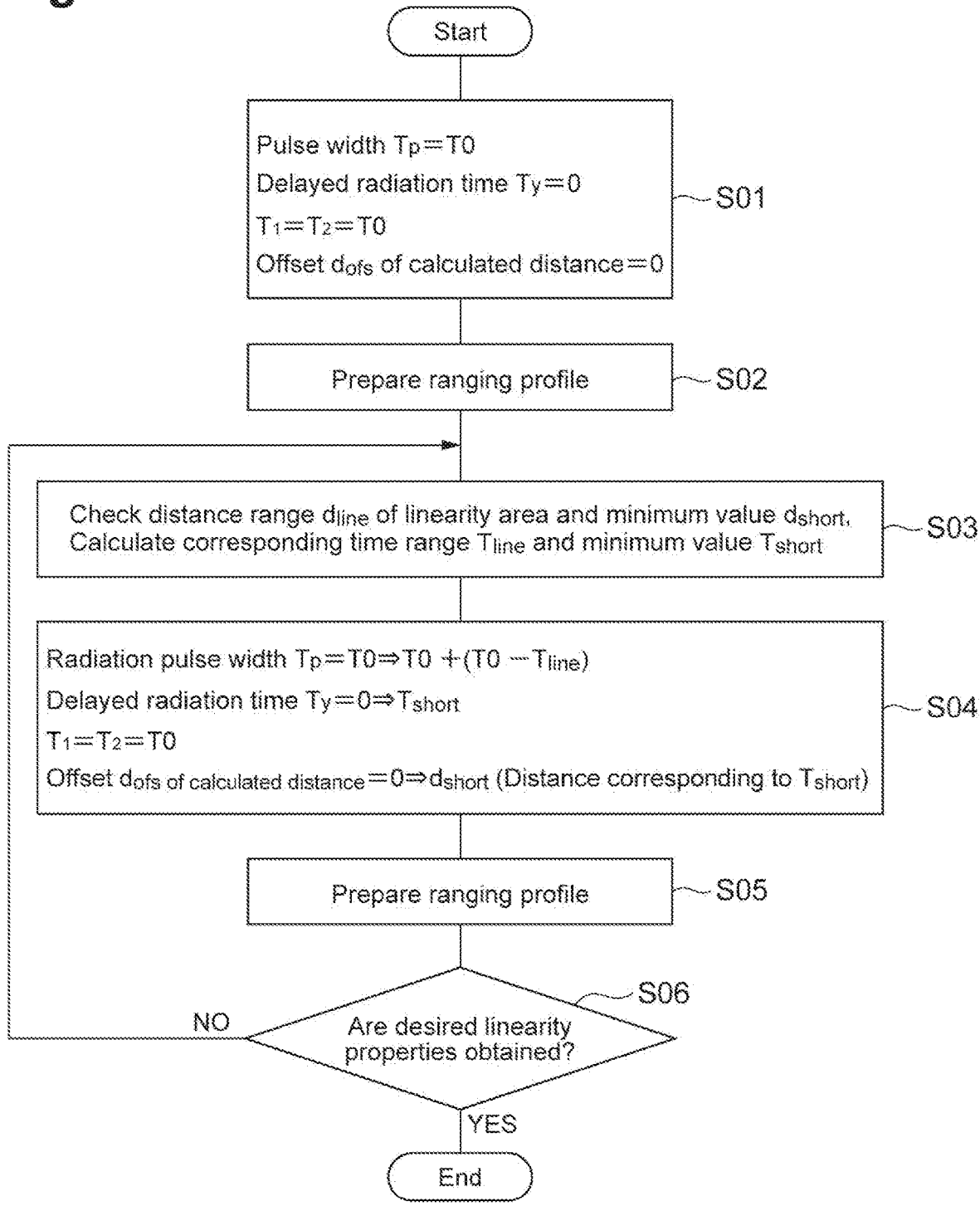
FIG. 11 is a flowchart illustrating a method of setting a light-intensity stable period and a delayed radiation time.
Figure 12:
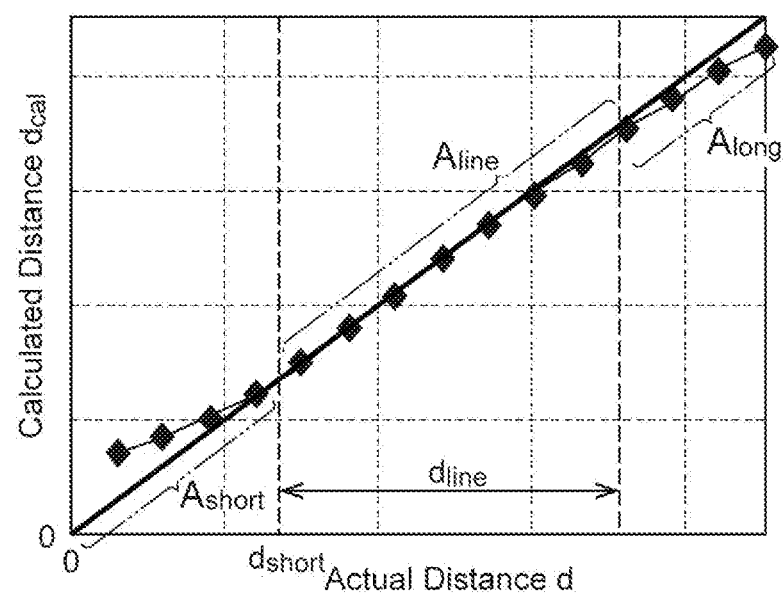
FIG. 12 is an example of the ranging profile.

With reference to FIG. 11, a method of setting in advance the light-intensity stable period $T_S$ and delayed radiation time Ty will be described. FIG. 11 is a flowchart illustrating a method of setting the light-intensity stable period and delayed radiation time. FIG. 12 is an example of the ranging profile.

As illustrated in FIG. 11, first, as an initial setting, various measurement conditions are set, as similar to the ranging method according to Comparative Example (Step S01). Specifically, the width of each of the first and second periods $T_1$, $T_2$ is set to a value T0 corresponding to the distance range to be measured and the ranging range is set. The pulse width Tp of the drive-signal $S_D$ is similarly set to T0. The delayed radiation time Ty is set to zero. In accordance with the delayed radiation time Ty, an offset $d_{ofs}$ of the delayed radiation time Ty with respect to the calculated distance $d_{cal}$ is set to zero.

Next, the ranging profile indicating the relationship between the calculated distance $d_{cal}$ and the actual distance d is prepared (Step S02). As illustrated in FIG. 12, the ranging profile is divided into the linearity area $A_{line}$, and the non-linearity areas $A_{short}$, $A_{long}$.

Next, in the ranging profile, a distance range $d_{line}$ of the linearity area $A_{line}$ and a minimum value $d_{short}$ of the distance range $d_{line}$ are checked and a time range $T_{line}$ and a minimum value $T_{short}$ thereof corresponding to the aforementioned distance range $d_{line}$ and the minimum value $d_{short}$ are calculated (Step S03). Herein, the minimum value $d_{short}$ of the linearity area $A_{line}$ corresponds to a value of the distance range of the non-linearity area $A_{short}$.

Next, the measurement conditions are set again (Step S04). Specifically, the pulse width Tp of the drive-signal $S_D$ is set to T0+(T0−$T_{line}$). The delayed radiation time Ty is set to $T_{Short}$. In accordance with the delayed radiation time Ty, the offset $d_{ofs}$ of the delayed radiation time Ty with respect to the calculated distance $d_{cal}$ is set to $d_{short}$. The width of each of the first and second periods $T_1$, $T_2$ will not be changed.

Next, the ranging profile is prepared again (Step S05). Next, it is determined whether desired linearity properties are obtained in the ranging profile (Step S06). Specifically, the distance range $d_{line}$ of the linearity area $A_{line}$ and minimum value $d_{short}$ of the linearity area $A_{line}$ are determined whether they are within desired ranges. The wider the distance range $d_{line}$, the wider becomes the distance range measurable with high accuracy. Furthermore, the smaller the minimum value $d_{short}$, the shorter becomes a minimum distance measurable with high accuracy.

In a case where the answer in Step S06 is YES, the process is completed. Accordingly, the minimum value $T_{Short}$ of the time range $T_{line}$ is set in advance as the delayed radiation time Ty. Furthermore, the time range $T_{line}$ corresponding to the linearity area $A_{line}$ is set in advance as the light-intensity stable period $T_S$. It should be noted that the pulse width Tp and extension time Tx are set in advance as a matter of course when the light-intensity stable period $T_S$ is set in advance. In a case where the answer in Step S06 is NO, the process moves on to Step S03 and the processes from Step S03 to S06 are repeated.

In the present embodiment, the influences of the rising period $T_R$ and falling period $T_F$ may not totally vanish and the whole ranging range cannot be set as the linearity area $A_{line}$ having high ranging accuracy. However, by setting the light-intensity stable period $T_S$ long in advance, the percentages of the rising period $T_R$ and falling period $T_F$ within the emission period $T_T$ of the pulse light Lp reduce relatively. Therefore, it is possible to reduce the influences of the rising period $T_R$ and falling period $T_F$. Accordingly, a percentage of the linearity area $A_{line}$ with high ranging accuracy in the entire ranging range increases. As a result, the ranging accuracy is improved.

As mentioned above, in the ranging method according to the present embodiment, when emitting the pulse light Lp from the light source LS, the pulse light Lp is emitted whose light-intensity stable period $T_S$ within the emission period $T_T$ of the pulse light Lp from the light source LS is set in advance to be longer than each of the first and second periods $T_1$, $T_2$.

The ranging device 10 according to the present embodiment includes the driving member DRV configured to drive the light source LS to emit the pulse light Lp whose light-intensity stable period $T_S$ within the emission period $T_T$ of the pulse light Lp is set in advance to be longer than each of the first and second periods $T_1$, $T_2$.

Accordingly, in regard to the quantities of charges $Q_1$, $Q_2$ accumulated in the first and second charge-accumulating areas FD1, FD2 during each of the first and second periods $T_1$, $T_2$, the percentage of the quantity of charges accumulated in accordance with the light-intensity stable period $T_S$ increases, and the percentages of the quantities of charges accumulated in accordance with the rising period $T_R$ and falling period $T_F$ decrease. Therefore, in regard to the quantity of charges $q_1$ which decreases from the ideal case due to the rising period $T_R$, the influence of such a quantity of charges $q_1$ with respect to the quantity of charges $Q_1$ becomes small. Furthermore, in regard to the quantity of charges $q_2$ which increases from the ideal case due to the falling period $T_F$, the influence of such a quantity of charges $q_2$ with respect to the quantity of charges $Q_2$ becomes small. As a result, the influences of the rising period $T_R$ and falling period $T_F$ of the light-intensity-signal $S_{Lp}$ with respect to the ranging accuracy are reduced. Accordingly, the ranging accuracy can be improved.

In the ranging method based on the abovementioned Formula (1), when the pulse width Tp of the drive-signal $S_D$ is set as long as the width of each of the first and second periods $T_1$, $T_2$, it is possible to measure from the distance where the phase difference Td is zero to the distance where the phase difference Td becomes equivalent to the width of each of the first and second periods $T_1$, $T_2$. However, even though the pulse width $T_p$ of the drive-signal $S_D$ is set as long as the width of each of the pulse first and second periods $T_1$, $T_2$, in fact, the width of the light-intensity stable period $T_S$ decreases due to the influences of the rising period $T_R$ and falling period $T_F$. On the other hand, when the pulse width $T_p$ of the drive-signal $S_D$ is set intentionally long in advance in such a manner that the width of the light-intensity stable period $T_S$ is set intentionally long in advance, it is possible to compensate for the influence caused by the decrease in the width of the light-intensity stable period $T_S$.

Furthermore, when emitting the pulse light Lp from the light source LS, the pulse light Lp is emitted later than the start time of the first period $T_1$ by the delayed radiation time Ty. Accordingly, in regard to the quantity of charges $Q_2$ accumulated in the second charge-accumulating area FD2 during the second period $T_2$, the percentage of the quantity of charges accumulated in accordance with the light-intensity stable period $T_S$ further increases. As a result, the ranging accuracy can be improved especially in regard to the short distance.

Furthermore, the delayed radiation time Ty of emission timing of the pulse light Lp with respect to the start time of the first period $T_1$ is set in advance to the minimum value $T_{Short}$ corresponding to the minimum value $d_{short}$ of the linearity area $A_{line}$ of the ranging profile indicating the correlation between the distance $d_{cal}$ obtained by the actual distance d and range sensors P (m, n). In such a case, it is possible to measure under a condition that the distance zero is offset to the minimum value $d_{short}$. Therefore, it is possible to improve the ranging accuracy even with respect to the distance range below the minimum value $d_{short}$.

Furthermore, the range sensors P (m, n) include the first and second charge-accumulating areas FD1, FD2, and first and second transfer-electrodes TX1, TX2 configured to transfer the charges generated in the charge-generating area to the first and second charge-accumulating areas FD1, FD2. The first and second transfer-electrodes TX1, TX2 are imparted with the first and second transfer-signals $S_1$, $S_2$ respectively. There is a 180-degree-shift between the phases of the first and second transfer-signals $S_1$, $S_2$. Accordingly, every time when the pulse light Lp is emitted for once, the generated charges are accumulated in each of the first and second charge-accumulating areas FD1, FD2 and the distance d to the object OJ can be obtained. Therefore, it is possible to prevent deterioration of the ranging accuracy due to the time variation of the distance d to the object OJ.

Figure 13:
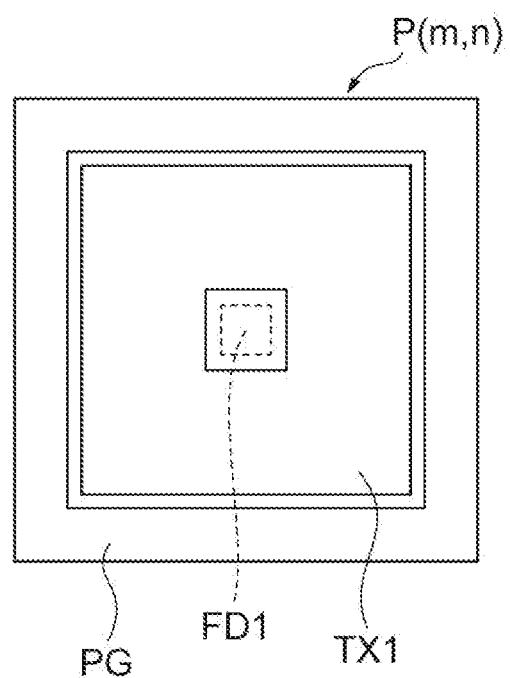
FIG. 13 is a view illustrating a configuration of a range sensor according to a modification.

Hereinafter, a modification of the present embodiment will be described. FIG. 13 is a view illustrating a configuration of a range sensor according to the modification. It should be noted that a light intercepting layer LI is omitted in FIG. 13.

As illustrated in FIG. 13, a range sensor P (m, n) according to the modification includes a photogate electrode PG, first charge-accumulating area FD1, and first transfer-electrode TX1. The range sensor P (m, n) according to the modification differs from the abovementioned embodiment in that it does not include the second charge-accumulating area FD2, and second transfer-electrode TX2.

The photogate electrode PG is of a rectangular ring shape in a plane view. In the present modification, the photogate electrode PG is of a square ring shape in a plane view. A periphery of the photogate electrode PG corresponds to a periphery of the range sensor P (m, n). The first charge-accumulating area FD1 is formed inside the square ring of the photogate electrode PG. The first charge-accumulating area FD1 is of a rectangular shape in a plane view. In the present modification, the first charge-accumulating area FD1 is of a square shape. The first charge-accumulating area FD1 seen from the plane view is disposed in a substantial center of the range sensor P (m, n).

The first transfer-electrode TX1 is formed between the photogate electrode PG and first charge-accumulating area FD1. The first transfer-electrode TX1 is of a rectangular ring shape in a plane view. In the present modification, the first charge-accumulating area FD1 is of a square ring shape in a plane view.

Figure 14:
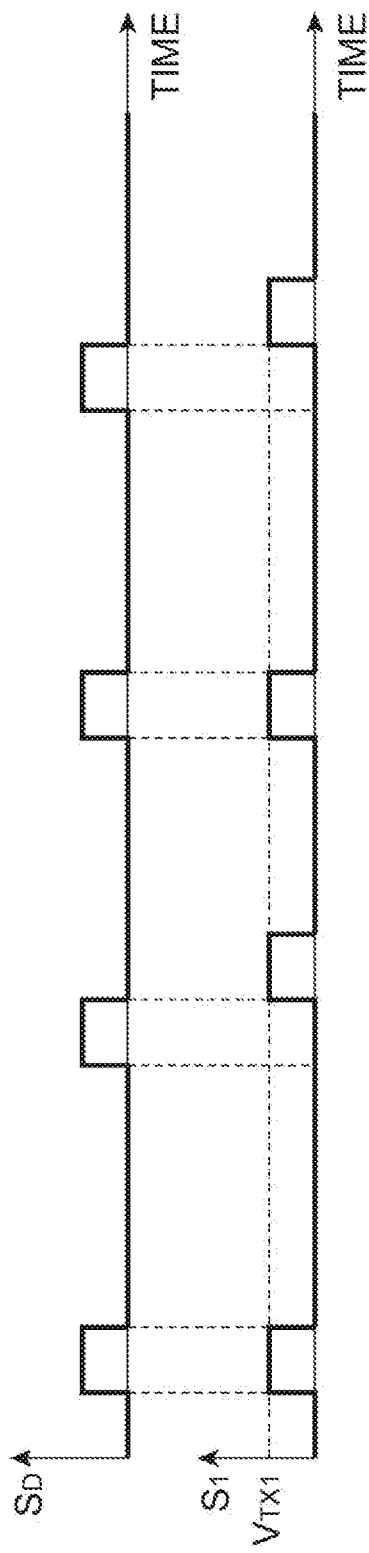
FIG. 14 is a timing chart of various signals in a ranging method according to the modification.

FIG. 14 is a timing chart of various signals in a ranging method according to the modification.

As illustrated in FIG. 14, a first transfer-signal $S_1$ applied to the first transfer-electrode TX1 is imparted with a phase shifted intermittently at a predetermined timing. In the present modification, the first transfer-signal $S_1$ is imparted with a phase shifted by 180 degrees at a timing of 180 degrees. The first transfer-signal $S_1$ synchronizes with a drive-signal $S_D$ at a timing of zero degree and has a phase difference of 180 degrees from the drive-signal $S_D$ at the timing of 180 degrees.

In the present modification, a quantity of charges $Q_1$ accumulated in the first charge-accumulating area FD1 at the timing of zero degree, and a quantity of charges $Q_2$ accumulated in the first charge-accumulating area FD1 at the timing of 180 degrees are read out in turns. A distance d is calculated based on these quantities of charges $Q_1$, $Q_2$.

In such manners, the range sensor P (m, n) includes the first transfer-electrode TX1 configured to transfer the charges generated in the charge-generating area to the first charge-accumulating area FD1. The first transfer-electrode TX1 is imparted with the first transfer-signal $S_1$ with the phase shifted intermittently by 180 degrees at the timing of 180 degrees. In such a case, ranging can be carried out by at least one first transfer-electrode TM1 and one first charge-accumulating area FD1. Therefore, the range sensor P (m, n) can be downsized.

The present invention should not be restricted to the aforementioned embodiment. For example, in the abovementioned embodiment, the extension time Tx and delayed radiation time Ty are set with preparation of the ranging profile, but the embodiment should not be restricted thereto. If there is known information in regard to a signal waveform of the light-intensity-signal $S_{Lp}$ of the pulse light Lp when the pulse light Lp is emitted from the light source LS, the extension time Tx and delayed radiation time Ty may be set based on the information. For example, if the width of the light-intensity stable period $T_S$ is known, a difference between the width of each of the first and second periods $T_1$, $T_2$ and the width of the light-intensity stable period $T_S$ can be set as the extension time Tx.

Furthermore, if the width of the rising period $T_R$ of the light-intensity-signal $S_{Lp}$ is known, a value subtracting the width of the rising period $T_R$ from the pulse width Tp of the drive-signal $S_D$ can be considered as the width of the light-intensity stable period $T_S$. Similarly, the extension time Tx can be set based on the considered width of the light-intensity stable period $T_S$.

Furthermore, when emitting the pulse light Lp from the light source LS, the pulse light Lp can be emitted before the start time of the first period $T_1$. In such a case, the value of the delayed radiation time Ty is negative. In an area close to the maximum value of the distance range rangeable by the abovementioned Formula (1), that is, for example, the non-linearity area $A_{long}$, the influence of rising period $T_R$ of the light-intensity-signal $S_{Lp}$ is large. In other words, in this area, the influence of the quantity of charges $q_1$ with respect to the quantity of charges $Q_1$ decreasing from the ideal case is large. By setting the delayed radiation time Ty to a negative value, the influence of the quantity of charges $q_1$ with respect to the quantity of charges $Q_1$ become small, which improves the ranging accuracy in this area.

In the range image sensor RS, each of the range sensors P (m, n) is arranged two-dimensionally, but each of them may be a line sensor arranged one-dimensionally. It should be noted that a two-dimensional image can also be obtained by rotating a line sensor or by scanning with two line sensors.

The range image sensor RS is not limited to the front-illuminated range image sensor. The range image sensor RS may be a back-illuminated range image sensor.

The charge-generating area where the charges are generated in accordance with the incident light may include a photodiode (for example, an embedded photodiode).

The conductivity types, that is, p-type and n-type, of the range image sensor RS according to the present embodiment may be replaced by each other so as to be opposite to those described above.

INDUSTRIAL APPLICABILITY

The present invention is applicable to a ranging method and a ranging device.

REFERENCE SIGNS LIST

10 RANGING DEVICE
$A_{line}$ LINEARITY AREA
d DISTANCE
$d_{short}$ MINIMUM VALUE OF LINEARITY AREA
FD1 FIRST CHARGE-ACCUMULATING AREA
FD2 SECOND CHARGE-ACCUMULATING AREA
P RANGE SENSOR
PG PHOTOGATE ELECTRODE
$S_1$ FIRST TRANSFER-SIGNAL
$S_2$ SECOND TRANSFER-SIGNAL
$T_1$ FIRST PERIOD
$T_2$ SECOND PERIOD
TX1 FIRST TRANSFER-ELECTRODE (CHARGE-TRANSFER UNIT)
TX2 SECOND TRANSFER-ELECTRODE (CHARGE-TRANSFER UNIT)
LS LIGHT SOURCE
CONT CONTROLLING MEMBER (CHARGE-TRANSFER UNIT)
DRV DRIVING MEMBER (LIGHT SOURCE DRIVING MEMBER)
ART ARITHMETIC MEMBER (DISTANCE ARITHMETIC MEMBER)
OJ OBJECT
Lp PULSE LIGHT
Lr REFLECTED LIGHT
$T_S$ LIGHT-INTENSITY STABLE PERIOD
$T_T$ EMISSION PERIOD OF PULSE LIGHT
Ty DELAYED RADIATION TIME (DELAY TIME)
$Q_1$, $Q_2$ QUANTITY OF CHARGES

The invention claimed is:

1. A ranging method in which a light source configured to emit pulse light with respect to an object and a range sensor are used, the range sensor including a charge-generating area in which charges are generated in accordance with incident reflected light of the pulse light reflected off the object and a charge-accumulating area in which the charges generated in the charge-generating area are accumulated, the ranging method comprising:

transferring the charges generated in the charge-generating area to the charge-accumulating area during a first period with respect to an emission period of the pulse light so as to accumulate the charges in the charge-accumulating area during the first period;

transferring the charges generated in the charge-generating area to the charge-accumulating area during a second period different from the first period in timing and similar to the first period in width so as to accumulate the charges in the charge-accumulating area during the second period;

arithmetizing a distance to the object based on a quantity of charges accumulated in the charge-accumulating area during the first period and a quantity of charges accumulated in the charge-accumulating area during the second period; and when emitting the pulse light from the light source, emitting the pulse light whose light-intensity stable period within the emission period of the pulse light is set in advance to be longer than each of the first and second periods, from the light source, the light-intensity stable period being a period when light intensity remains at a predetermined value or more.

2. The ranging method according to claim 1, wherein the pulse light is emitted after a start time of the first period, when emitting the pulse light from the light source.

3. The ranging method according to claim 2, a delay time of emission timing of the pulse light with respect to the start time of the first period is set in advance to a time corresponding to a minimum value of a linearity area of a ranging profile which indicates a correlation between an actual distance and a distance obtained by the range sensor.

4. The ranging method according to claim 1, wherein
the range sensor includes a plurality of the charge-accumulating areas and a plurality of transfer-electrodes configured to transfer the charges generated in the charge-generating area to the plurality of charge-accumulating areas, and
the plurality of transfer-electrodes are imparted with transfer-signals having different phases.

5. The ranging method according to claim 1, wherein
the range sensor includes a transfer-electrode configured to transfer the charges generated in the charge-generating area to the charge-accumulating area, and
the transfer-electrode is imparted with a transfer-signal having a phase shifted intermittently at a predetermined timing.

6. The ranging method according to claim 1, wherein the light-intensity stable period is a period when the light intensity is held at or within 5% of a maximum value.

7. The ranging method according to claim 1, wherein the pulse light has a trapezoidal waveform including a rising period, the light-intensity stable period, and a falling period, and
wherein, during the rising period, the light intensity gradually increases and reaches a predetermined value; during the light-intensity stable period, the light intensity remains at the predetermined value or more; and during the falling period, the light intensity falls below the predetermined value and decreases.

8. The ranging method according to claim 1, wherein the pulse light has a trapezoidal waveform including a rising period, the light-intensity stable period, and a falling period, and
wherein the light-intensity stable period is a period when the rising period and falling period are subtracted from the emission period of the pulse light.

9. A ranging device including a light source configured to emit pulse light with respect to an object and a range sensor configured to include a charge-generating area in which charges are generated in accordance with incident reflected light of the pulse light reflected off the object and a charge-accumulating area in which the charges generated in the charge-generating area are accumulated, the ranging device comprising:
- a charge-transfer unit configured to transfer the charges generated in the charge-generating area to the charge-accumulating area during a first period with respect to an emission period of the pulse light so as to accumulate the charges in the charge-accumulating area during the first period and configured to transfer the charges generated in the charge-generating area to the charge-accumulating area during a second period different from the first period in timing and similar to the first period in width so as to accumulate the charges in the charge-accumulating area during the second period;
- a distance arithmetic member configured to arithmetize a distance to the object based on a quantity of charges accumulated in the charge-accumulating area during the first period and a quantity of charges accumulated in the charge-accumulating area during the second period; and
- a light source driving member configured to drive the light source to emit the pulse light whose light-intensity stable period within the emission period of the pulse light is set in advance to be longer than each of the first and second periods, from the light source, the light-intensity stable period being a period when light intensity remains at a predetermined value or more.

* * * * *